United States Patent [19]
Ochiai et al.

[11] Patent Number: 6,121,623
[45] Date of Patent: Sep. 19, 2000

[54] PARALLEL RADIATION DETECTOR

[75] Inventors: Isao Ochiai, Otsuki; Kimio Kanda, Hitachinaka; Takehiro Ohkawa, Kunitachi, all of Japan

[73] Assignee: Hitachi, Ltd., Tokyo, Japan

[21] Appl. No.: 09/165,199

[22] Filed: Oct. 2, 1998

[30] Foreign Application Priority Data

Oct. 3, 1997 [JP] Japan ................................. 9-270799

[51] Int. Cl.$^7$ ................................................. H01J 37/252
[52] U.S. Cl. ............................................. 250/397; 378/90
[58] Field of Search ................................. 250/310, 397; 378/45, 49, 90

[56] References Cited

U.S. PATENT DOCUMENTS 5,065,020  11/1991  Kanda ...................................... 250/310

FOREIGN PATENT DOCUMENTS

| 3-26980 | 2/1991 | Japan . |
| 3-246862 | 11/1991 | Japan . |
| 6-27245 | 2/1994 | Japan . |
| 9-92868 | 4/1997 | Japan . |

*Primary Examiner*—Kiet T. Nguyen
*Attorney, Agent, or Firm*—Antonelli, Terry, Stout & Kraus, LLP

[57] ABSTRACT

A parallel radiation detector includes a plurality of radiation detecting elements, a plurality of preamplifiers for converting signals from the radiation detecting elements into voltage signals, a signal processing device for processing the voltage signals, a main control device for controlling the signal processing device to analyze the voltage signals, a display device for displaying analyzed results from the signal processing device, a storage device for storing signals, a plurality of reset circuits corresponding to the plurality of preamplifiers, each reset circuit for generating a reset signal for returning the corresponding one of the preamplifiers to an initial state thereof when the voltage signal from the corresponding one of the preamplifiers reaches a predetermined voltage, and an inhibitor circuit for generating an inhibit signal for inhibiting the signal processing device from receiving and processing the voltage signals from the preamplifiers temporarily, based on the reset signal.

15 Claims, 7 Drawing Sheets

PARALLEL RADIATION DETECTOR

BACKGROUND OF THE INVENTION

The present invention relates to a technology for detecting and analyzing with high sensitivity and accuracy, characteristic x-rays produced by bombarding a specimen with charged particles such as electrons in particular, or fluorescent x-rays produced by bombarding a specimen with x-rays.

For elementary analysis, there is a method by using characteristic x-rays or fluorescent x-rays produced by bombarding a specimen with charged particles such as electrons or x-rays, respectively.

This method makes use of the fact that characteristic x-rays or fluorescent x-rays emitted from a particular specimen have an energy peculiar to an element constituting the specimen. It is necessary for the elementary analysis that occurrence of the x-rays per unit time is counted for different energy of the x-rays. In general, semiconductor detecting elements made from semiconductor crystals such as Si or Ge are used for detection of x-rays.

Typical semiconductor detecting element are of the diode structure in which a pair of electrodes sandwich a semiconductor. When x-rays enter a depletion layer formed in the semiconductor by a voltage applied between the pair of electrodes in the reverse direction, secondary electrons are produced and generate electron-hole pairs proportional in number to the energy of the incident x-rays as the secondary electrons lose their energy. The generated electron and hole are attracted to the respective electrodes by the electric field between the electrodes and are extracted as a signal.

FIG. 4 shows a typical arrangement of a radiation detector employing the above semiconductor-type detecting element. X-rays 1 produced by bombarding a specimen 9 with electrons are detected by a detecting element 101. The detecting element 101 and a field effect transistor 2 at the input stage of a preamplifier 31 are cooled to a low temperature by a cryostat 7 to reduce noise.

The following explains processing of the signal obtained by the detecting elements. The electrons arriving at the electrode of the detecting element 101 are converted into voltage pulses 220 of heights proportional to the number of the electrons by a charge-sensitive preamplifier 31, and the voltage pulses 220 are filtered to increase its signal-to-noise ratio and shaped into voltage pulses 310 by a shaping amplifier 51. The voltage pulses 310 are analyzed in terms of their height to provide a pulse-height spectrum 400 of the x-rays.

The heights of the voltage pulses 310 corresponding to x-rays of a specific energy are not constant but varied due to the statistical fluctuation of the number of generated electron-hole pairs and noise in a pre-amplifier 31. Accordingly, a peak 501 in the spectrum 400 obtained by the pulse height analyzer 53 has a width of some value. The width 410 of the peak 501 at half its maximum height is called energy resolution. As the energy resolution is higher, i.e., the width of the peak is narrower, the signal-to-noise ratio becomes higher, the separation from peaks of other elements is improved, and the elementary analysis becomes more accurate.

A preamplifier circuit shown in FIG. 5 is of the light pulse feedback type described in IEEE Transaction on Nuclear Science, Vol. 18, No. 1, 1971, pp. 115–124, and FIG. 6 shows outputs of the preamplifier to specific incident x-rays.

In FIG. 5, the preamplifier circuit 31 comprises a field effect transistor 2 which works as, the first input stage, a light emitting diode 4, a feedback capacitor 6, an amplifying circuit element 8 which amplifies signals from the field effect transistor 2, and a comparator 55, and reference numeral 41 denotes a power supply.

Charges produced by incident x-rays 1 at the detecting elements 101 are stored in the feedback capacitor 6 and the output 220 at the preamplifier 31 build up stepwise as shown in FIG. 6. A succeeding circuit extracts steps 221 in the staircase waveform output 220 as x-ray signals. The output 220 increases stepwise for each incident x-ray and will rise close to a power supply voltage provided for this circuit and saturate eventually if no proper measures are taken.

In order to prevent the saturation of charges stored in the feedback capacitor 6, the following scheme is adopted. The comparator 55 generates a reset signal 223 when the level of output 220 reaches a predetermined value 222. By the reset signal 223, the light emitting diode 4 emits light 150 onto the field effect transistor 2. By this irradiation, a current can flow between its gate and source. The charges stored in the feedback capacitor 6 are discharged through this path and the level of the output 220 is returned to the initial state (reset). A high energy resolution is reported to be obtained by this method.

In addition to the above-described resetting method called light-pulse feedback, there are known a method employing a five-terminal field effect transistor as described in IEEE Transaction on Nuclear Science, Vol. 37, No. 2, 1990, pp. 452–456, pulse, and a method by taking advantage of impact ionization phenomenon as described in Nuclear Instruments and Physics Research, Vol. A378, 1996, pp. 583–588. They are different in a method of discharging a feedback capacitor, but they provide basically identical outputs.

A general-purpose shaping amplifier employs a semi-Gaussian filter for simplicity of construction, which is composed of an analog differentiator and plural stages of integrators as described in G. Bertolini, A. Coche, Semiconductor Detectors, North Holland, Amsterdam, 1968, pp. 232–236.

Among different types of filters, a cusp filter is ideal as described in Nuclear Instruments and Methods in Physics Research, Vol. A297, 1990, pp. 467–478, and the energy resolution by the use of the cusp filter is improved by 16% compared with that by the use of the semi-Gaussian filter. But cusp filters are difficult to realize and in actual practice, triangular filters are used which have intermediate performance between semi-Gaussian and cusp filters. Recently, to realize n ideal filter, filters of a digital signal processing type appeared. This type of filters convert outputs from a preamplifier into digital signals by an analog-to-digital converter and filter the signals in a digital domain as described in U.S. Pat. No. 5,349,193.

It is also effective for improving the sensitivity of the elementary analysis to receive x-rays from a specimen with an increased acceptance solid angle of the detector efficiently. The acceptance solid angle of the detector is inversely proportional to the square of a distance from the specimen to the detector and is proportional to the sensitive area of the detector. Accordingly, as the distance becomes shorter and the sensitive area becomes larger, the acceptance solid angle becomes larger. The distance is determined by considering damage of the detecting element and an available space.

The increase in the sensitive area deteriorates the energy resolution and increases difficulties in its fabrication, and the maximum practical sensitive area is several tens square millimeters. Therefore the acceptance solid angle of the detectors of the energy-dispersive x-ray spectroscopes for use in electron microscopes is in the range of 0.1 to 0.3 steradians at the most.

As another method of improving analyzing sensitivity, it is conceivable to increase a dosage of charged particles or x-rays to be irradiated onto the specimen and consequently to increase the amount of x-rays emitted from the specimen. But, in the above circuit, because of prevention of superimposition of pulses and the time required for conversion into pulse-height analysis, the maximum allowable amount of incident x-rays is several thousands per second and it is of no use to increase the dosage of x-ray radiation beyond the above maximum allowable amount. The dosage of x-rays onto specimens is also limited by damage caused to the specimens and it is desirable to minimize the dosage for an analysis of a biological specimen or a very small region of one nanometers square because they easily suffer serious damage.

In the above explanation, only one detecting element is used for the analysis. For the purpose of increasing the acceptance solid angle of the detector, Japanese Patent Application Laid-Open No. Hei 3-246862 discloses the arrangement of a pair of radiation detectors, and Japanese Patent Application Laid-Open No. Hei 9-92868 discloses the arrangement of plural detecting elements disposed in one container.

As a control system for a device including plural semiconductor detecting elements and plural charge-sensitive preamplifiers, Japanese Patent Application Laid-open No. Hei 3-26980 discloses a method which uses an additional circuit for comparing outputs of charge-sensitive preamplifiers each including a feedback capacitor and a feedback resistor with a reference voltage, and for discharging all the feedback capacitors if at least one of the outputs of the charge-sensitive preamplifiers reaches the reference voltage.

The above first method by arranging plural radiation detectors requires plural containers for housing the respective detecting elements and plural cryostats, and there arises a problem in that the volume occupied by the detectors increases, its operation flexibility is lowered, and its cost approximately doubles.

On the other hand, the above second method by housing plural detecting elements in one container does not consider influence by the interaction between signals from the different detecting elements. There is a problem in that, when one preamplifier is reset, another preamplifier receives noise, and consequently the energy resolution is degraded, or spurious peaks appear in the spectrum.

No consideration has been given to a problem in that the capacitance of the feedback capacitor which determines the gain of the preamplifier is influenced by its positional tolerances or its wiring, and leakage currents in the detecting elements differ from element to element, and consequently the output characteristics at the detecting elements and at the preamplifiers vary among the detecting elements and the preamplifiers, and the adjustment and correction for the variations between the outputs are complicated.

The above third method uses an additional circuit for comparing outputs of charge-sensitive preamplifiers with a reference voltage, and for discharging all the feedback capacitors if at least one of the outputs of the charge-sensitive preamplifiers reaches the reference voltage. This method is applicable to a preamplifier including a feedback capacitor and a feedback resistor in its feedback loop, but there has been a problem in that the energy resolution is inherently poor. No consideration has been given to the radiation detector having plural preamplifiers each provided with an independent reset circuit, to which the present invention is directed.

The following describes the results obtained by the present inventors for the arrangement of two detecting elements housed in one container and two prior art signal detection circuits.

FIG. 7 illustrates two x-rays of a manganese K α (MnK α) line (5.9 keV) and a manganese Kβ (MnKβ) line (6.5 keV) in an x-ray spectrum produced by radiation from a sealed iron isotope having the mass number 55, which are often used for evaluating the energy resolution of an x-ray radiation detector in the low-energy region. Peaks 311 and 312 indicate MnKa and MnKβ lines respectively. A peak 313 was observed by a radiation detector employing one detecting element.

To investigate the cause for appearance of the peak 313, the out put wave forms of a pair of preamplifiers for the two detecting elements were studied. FIG. 8 shows an output 224 from one of the preamplifiers and an output 225 from the other of the amplifiers. Noise 227 was observed to ride on the output waveform 225 from the other amplifier when the waveform 224 from the one preamplifier is reset, and vice versa. It was found that the peak 313 was caused by the above noise. This noise is influenced by how internal electrical wirings are fabricated and where they are disposed. Noise appears as a peak having various heights at various positions and deteriorates energy resolution.

Although the combination of two detecting elements and signal detection circuits produces twice the amount of signal by a single detecting element, by using the sum of the spectrum from the two detecting elements in the identical measuring time, there is a problem in that a spurious peak is observed as described above, and consequently the analysis provides incorrect results or the measurement is not possible because of superimposition of a spurious peak on a peak produced by an element to be analyzed. Although it is conceivable to ignore noise caused by reset by distinguishing the noise from intended signals by digital signal processing, there is a problem in that a circuit for that processing is complicated and is costly.

SUMMARY OF THE INVENTION

An object of the present invention is to provide a radiation detector suitable for the type having plural detecting elements disposed in one container and having improved noise immunity and high sensitivity.

To achieve the above-mentioned object, a parallel radiation detector of the present invention includes a plurality of semiconductor radiation detecting elements, a like plurality of preamplifiers for converting signals from the semiconductor radiation detecting elements into voltage signals, a signal processing device for processing the voltage signals, a main control device for controlling the signal processing device to analyze the voltage signals, a display device for displaying analyzed results from the signal processing device, a storage device for storing signals, a plurality of reset circuits corresponding to the plurality of preamplifiers, each reset circuit for generating a reset signal for returning the corresponding one of the preamplifiers to an initial state thereof when the voltage signal from the corresponding one of the preamplifiers reaches a predetermined voltage, and an inhibitor circuit for generating an inhibit signal for inhibiting the signal processing device from receiving and processing the voltage signals from the preamplifiers temporarily, based on the reset signal.

In the prior art radiation detector, each time the respective preamplifiers were reset to their respective initial states independently of each other, depending upon their respective output voltages, each of the preamplifiers were interfered with noise produced by others of the preamplifiers and therefore accurate signals were not obtained.

Since the present invention inhibits all of signals from being collected every time one of the preamplifiers is reset, the present invention has eliminated a problem of influences of interfering external noise with the prior art radiation detectors and makes possible the high-sensitive and high-precision analysis of radiation such as x-rays.

Further, in an embodiment of the present invention, each of the preamplifiers is provided with a gain-correcting circuit so as to adjust and to approximately equalize the signal outputs from the respective preamplifiers, and in another embodiment of the present invention, a circuit is provided such that a digital signal processing part provides data corresponding to x-ray energy, and such that the reduced number of the device components can process the signals from a plurality of radiation detecting elements.

BRIEF DESCRIPTION OF THE DRAWINGS

In the accompanying drawings, in which like reference numerals designate similar components throughout the figures, and in which.

DETAILED DESCRIPTION OF THE PREFERRED EMBODIMENTS

The embodiments of the present invention will be explained hereunder by reference to the drawings.

Figure 1:
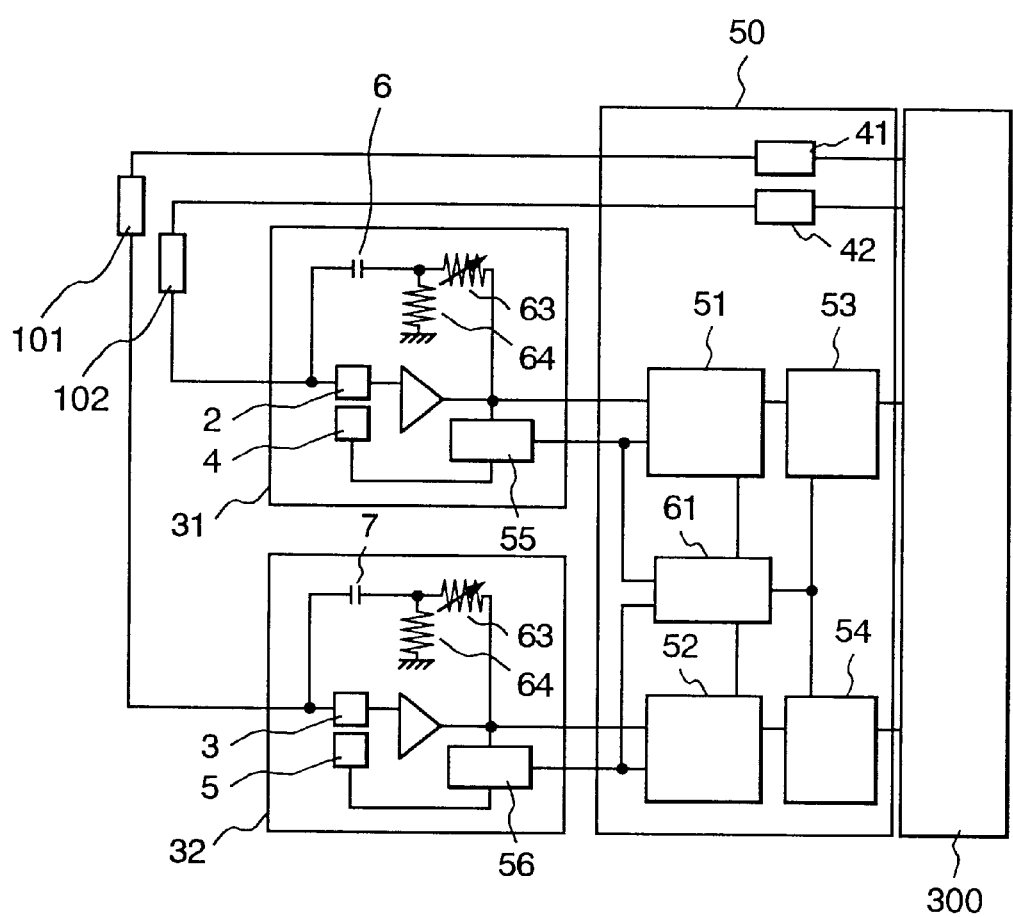
FIG. 1 is a circuit diagram for a parallel radiation detector of a first embodiment of the present invention.
Figure 2:
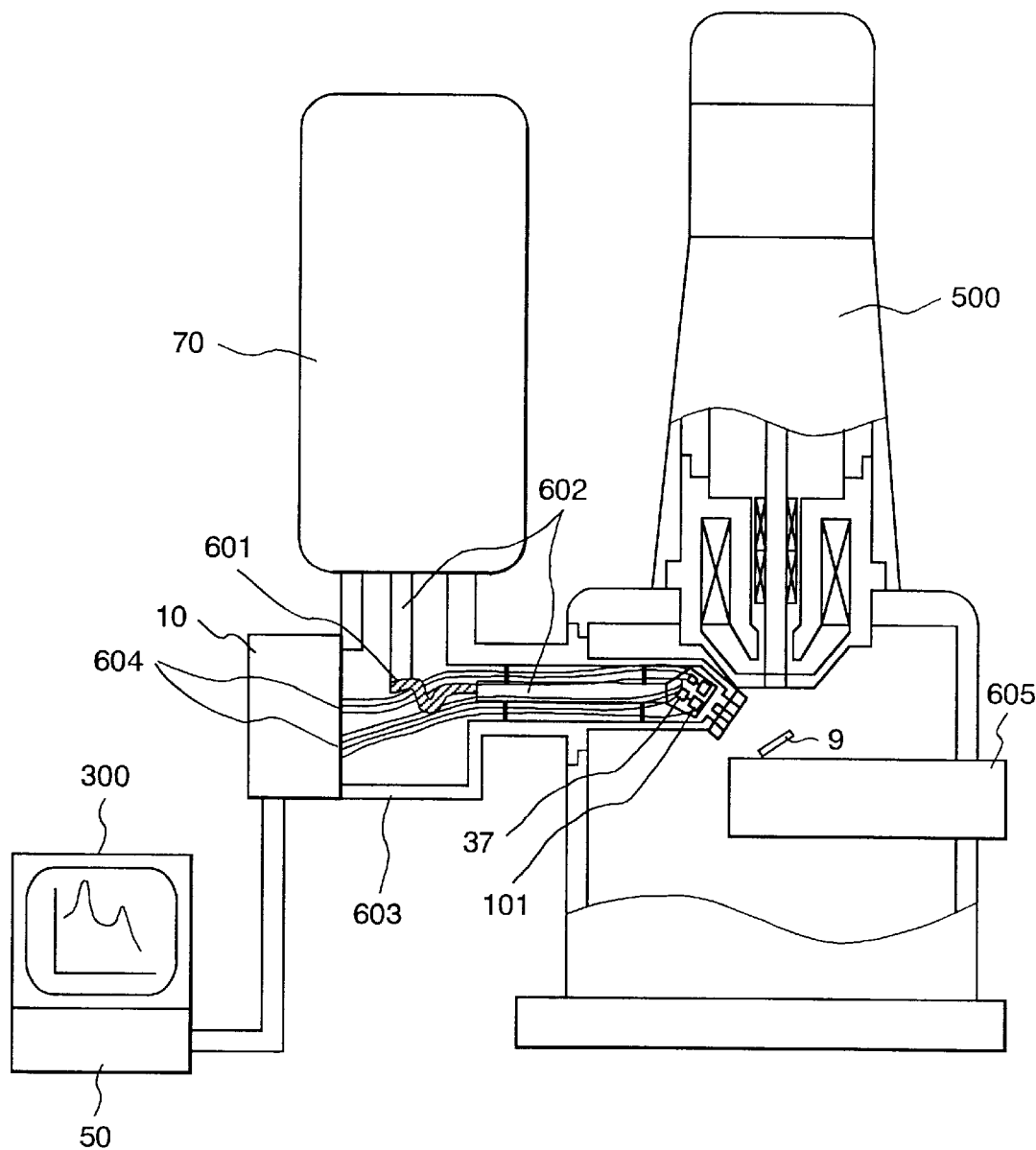
FIG. 2 is a diagram illustrating the arrangement of the parallel radiation detector of the first embodiment of the present invention.

FIG. 1 is a circuit diagram for a parallel radiation detector of an embodiment in accordance with the present invention and FIG. 2 is an illustration of an arrangement of the parallel radiation detector of the present invention used with a scanning electron microscope 500.

In this embodiment, the parallel radiation detector employs a pair of silicon semiconductor detecting elements 101 and 102 as shown in FIGS. 1 and 2. The two detecting elements 101 and 102 are reverse-biased by voltage sources 41 and 42 connected to one terminal of the respective detecting elements. The remaining terminals of the detecting elements 101 and 102 are connected to field effect transistors 2 and 3 at the input stages of the preamplifiers 31 and 32, respectively. The field effect transistors 2 and 3 in combination with light emitting diodes 4 and 5, and feedback capacitors 6 and 7 are housed in a ceramic container 37 (FIG. 2). The detecting elements 101, 102 and the field effect transistors 2, 3 are cooled by a cryostat 70 using liquid nitrogen via a woven wire mesh 601 and cooling rods 602 (FIG. 2).

The detecting elements 101, 102, the ceramic container 37, the woven wire mesh 601 and the cooling rods 602 are housed in an evacuated container 603. The detecting elements 101, 102 are connected with the preamplifiers 31, 32 housed in a box 10 by wires 604.

The outputs of the two preamplifiers 31, 32 are fed to a signal processing device 50, which are composed of shaping amplifiers 51, 52, pulse-height analyzer 53, 54, and a reset control circuits 61.

Information from the pulse-height analyzers 53, 54 is fed to a main control device 300 which performs operations such as addition of signals from the two detecting elements. This system is structured such that the kind of element contained in a specimen 9 (FIG. 2) is identified, and the concentration of the element and a two-dimensional distribution of the element are calculated and represented by using information about the position of a scanning electron beam from the electron microscope 500.

The preamplifiers 31, 32 are mounted on a single circuit board and a driving power source is used in common for the two preamplifiers for compaction such that they are housed in the single box 10 made of aluminum. The specimen 9 is supported by a sample stage 605, and can be moved and tilted.

Figure 9:
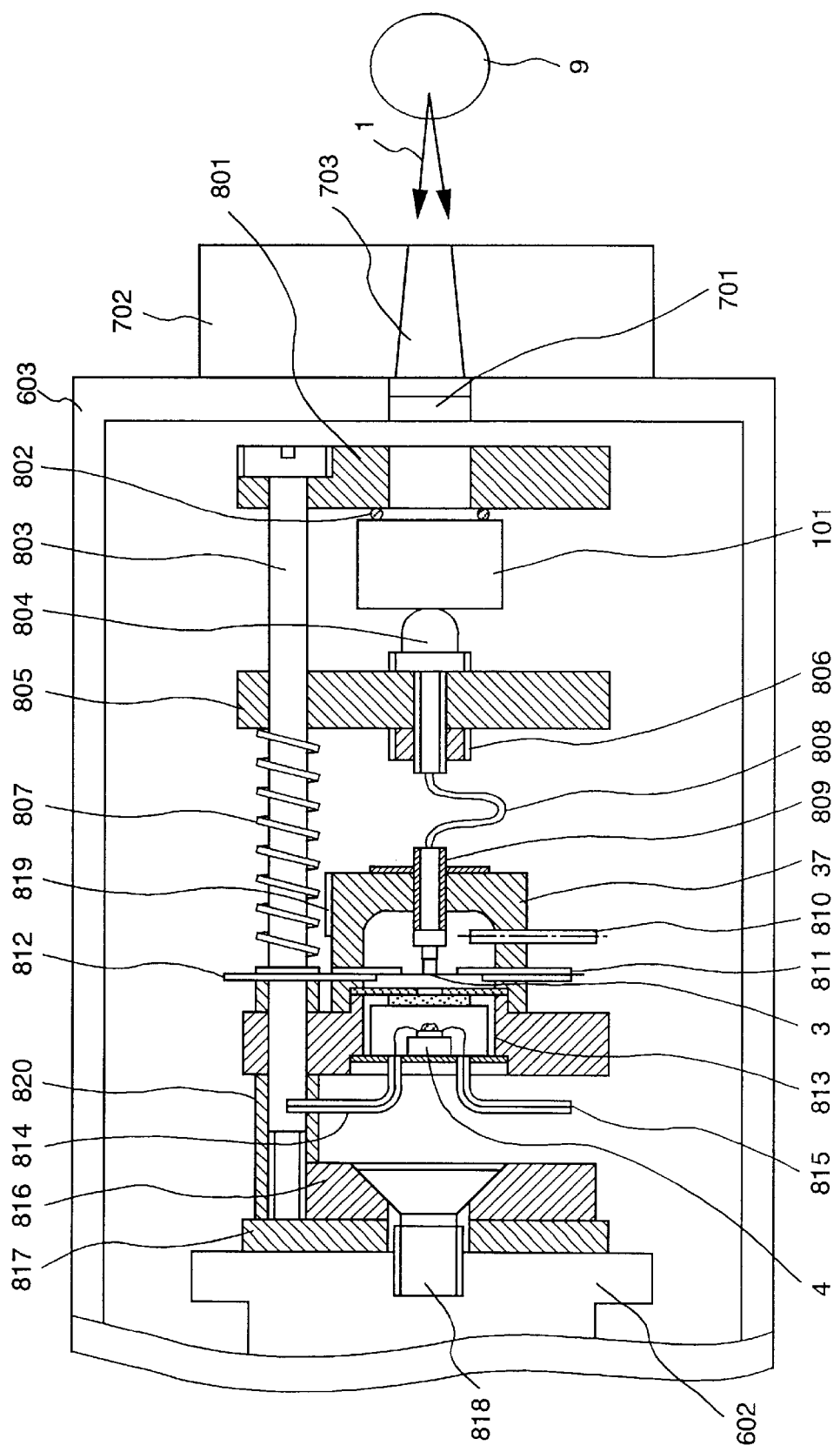
FIG. 9 is a detailed cross-sectional view of the detecting element 101 and its vicinity in the first embodiment of FIG. 2 of the present invention.

The internal structure of the vacuum container 603 will be explained in detail by reference to FIG. 9. FIG. 9 is a detailed cross-sectional view of the detecting element 101 and its vicinity. FIG. 9 shows only the detecting element 101 of the two detecting elements in a section plane perpendicular to the sheet of FIG. 2.

The detecting element 101 with a wire 802 made of soft metal indium adhered on its front surface is held with a combination of a metal holding plate 801 formed with an x-ray-transmitting aperture, a conductive terminal 804 fixed on an insulating plate 805 with a nut 806 for extracting a signal from the detecting element 101, a pair of bolts 803 (only one of which is shown) and a pair of springs 807 (only one of which is shown).

The springs 807 makes possible the holding of the detecting element 101 without damaging it and easy replacement of the detecting element 101 in repair of the detector. The conductive terminal 804 is connected to a gate electrode 809 of a field effect transistor 3 disposed in the ceramic container 37 with a copper wire 808. The copper wire 808 is long enough for the insulating plate 805 to be moved for replacement of the detecting element 101. The ceramic container 37 houses the light emitting diode 4 in addition to the field effect transistor 3.

This embodiment uses a light emitting diode contained in a metal container 813 as the light emitting diode 4. An electrode 810 of the feedback capacitor 7 is disposed at a distance of about 0.5 mm from the gate electrode 809 to form a vacuum capacitor. The measured capacitance of the vacuum capacitor in this embodiment was about 50 femtfarads.

A source electrode 811 and a drain electrode 812 are connected to a source and a drain of the field effect transistor 3, respectively. A resistor 819 is attached on the outside of the ceramic container 37 with adhesive such that the temperature of the ceramic container 37 can be adjusted by heat generated by passing a current through the resistor 819. By adjusting the current, the temperature of the ceramic container 37 is adjusted for a temperature (about −150° C.) at which noise occurring in the field effect transistor 3 can be minimized.

The ceramic container 37 is fixed on a metal base 816 with a spacer 820 therebetween with the bolts 803 and the springs 807. The spacer 820 secures a space for disposing the electrodes 814, 815 for supplying power to the light emitting diode 4. A bolt 818 fixes the metal base 816 to the cooling rod 602 coupled to liquid nitrogen in the liquid nitrogen tank 70 with an insulating plate 817 interposed between the metal plate 816 and the cooling rod 602.

This structure cools the detecting element 101 and the field effect transistor 3 to a low temperature. Although not shown in FIG. 9, electrical wiring is provided from the preamplifier box 10 (see FIG. 2) to the metal holding plate 801, the electrode 810 of the feedback capacitor, the source electrode 811, the drain electrode 812, the electrodes 814, 815 for the light emitting diode 4 and the resistor 819. The number of wires is eight for each of the detecting elements.

An x-ray-transmitting window 701 and a reflected-electron remover 702 are disposed in front of the container 603. The reflected-electron remover 702 is provided with a permanent magnet for generating such a magnetic field to deflect electrons from the specimen 9 and to prevent them from entering the detecting element 101.

The x-ray-transmitting window 701 separates the space within the container 603 from the space in which the specimen 9 is placed such that the space within the container 603 does not return to atmospheric pressure even if the space containing the specimen 9 is opened and is returned to atmospheric pressure for changing specimens 9.

Comparators 55, 56 inspect the output voltage levels of the preamplifiers 31, 32, and cause the light emitting diodes 4,5 to emit light, respectively, when the output voltage levels reach 0 V.

The voltage applied to the light emitting diodes and the time during which the light emitting diodes emit light are set such that the feedback capacitors will be discharged to lower the output voltages to about −1.5 volts, as described in connection with the prior art. The light-emitting time is about 10 μsec.

Simultaneously with discharging of the feedback capacitors, a signal is fed to the reset-signal control circuit 61 which is one of distinguishing features of the present invention.

When the reset-signal control circuit 61 receives the signal from at least one of the comparators 55, 56, the reset-signal control circuit 61 sends an inhibit signal to the shaping amplifiers 51, 52 and the pulse-height analyzers 53, 54 such that the shaping amplifiers 51, 52 and the pulse-height analyzers 53, 54 ignore signals inputted to them during the time required for them to return to their initial states.

In this embodiment, the time adjustment circuit provided in the reset-signal control circuit 61 is set such that the shaping amplifiers 51, 52 and the pulse-height analyzers 53, 54 ignore the input signals for time (20 μsec for example) longer than the reset time, that is, time sufficient for noise caused by resetting to disappear completely.

Each preamplifier in this embodiment is provided with a gain-correction circuit which is another one of the distinguishing features of the present invention and is comprised of a fixed resistor 64 and a variable resistor 63.

The variable resistors 63 and 63 are adjusted to approximately equalize the two outputs from the two detecting elements 101, 102 with each other for the MnK line. The gains of the two shaping amplifiers 51, 52 are adjusted by the main control circuit 300 to provide two equal shaping amplifier outputs for incident x-ray radiation having equal energy. This adjustment enables the same address in a memory for storing spectrum data to be used for the two pulse-height analyzers 53, 54 in common. As a result, the algebraic addition provides the sum of the spectrum obtained by the detecting elements 101 and 102.

The parallel radiation detector of this embodiment can eliminate influence of noise caused by resetting which was a problem in the prior art detectors, and provide a true spectrum data.

The parallel radiation detector of this embodiment can also provide the energy resolution equal to that obtained by a single detecting element.

Further the parallel radiation detector of this embodiment approximately doubles the acceptance solid angle of the detector by detecting the signals from the two detecting elements at the same time, consequently can halve the measuring time required for analyzing with sensitivity equal to a single detecting element, and can increase the measuring sensitivity by a factor of 1.4 in the identical measuring time.

Figure 3:
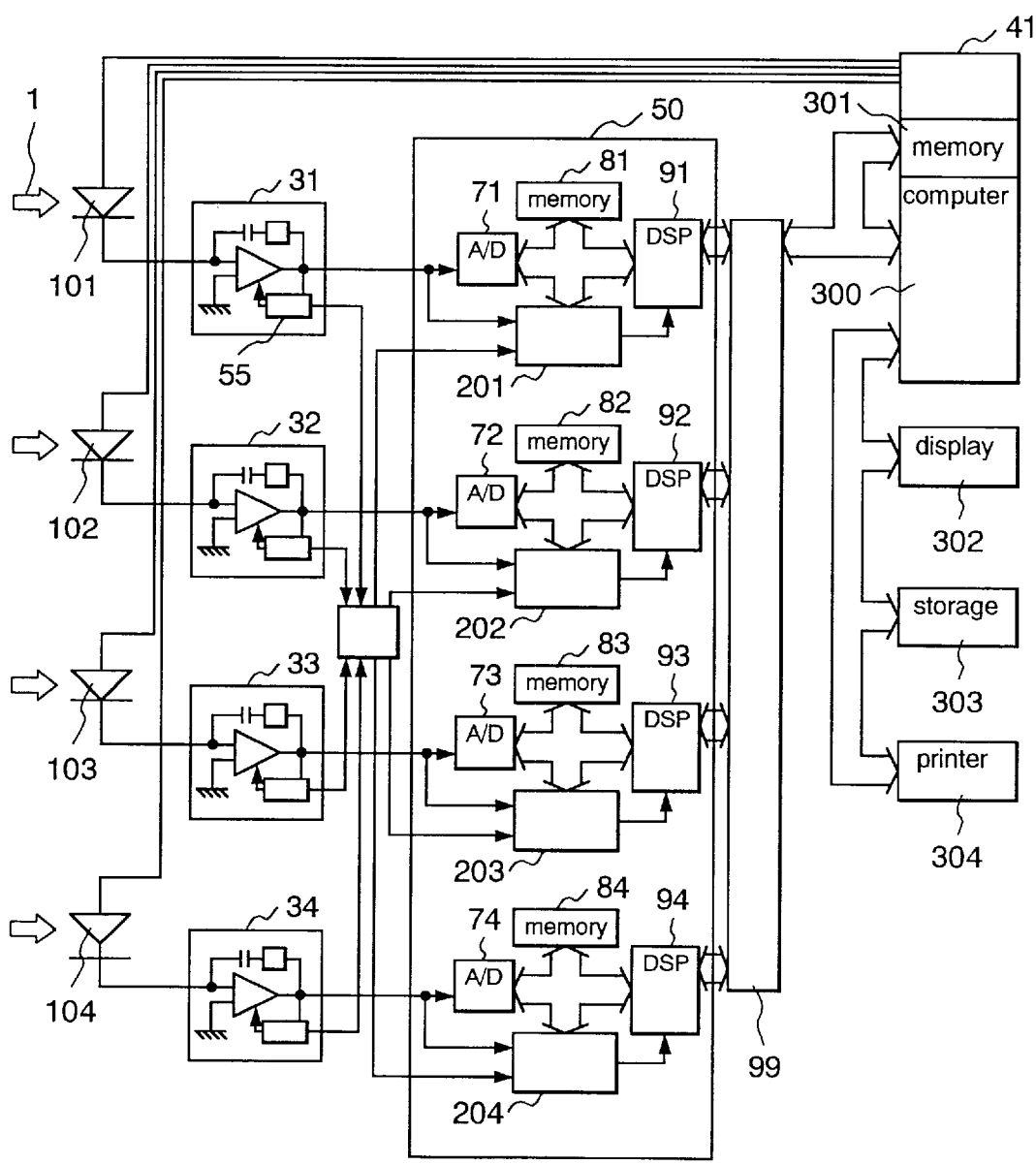
FIG. 3 is a circuit diagram for a parallel radiation detector of a second embodiment of the present invention.
Figure 4:
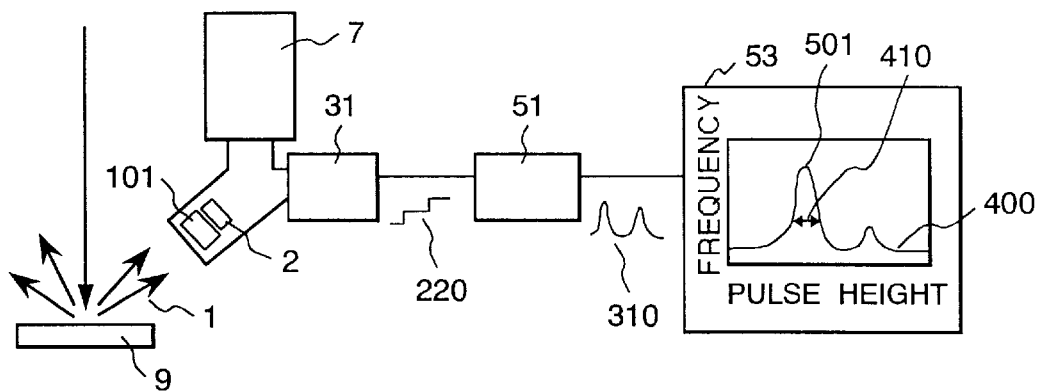
FIG. 4 is a diagram for explaining a method of detecting radiation.
Figure 5:
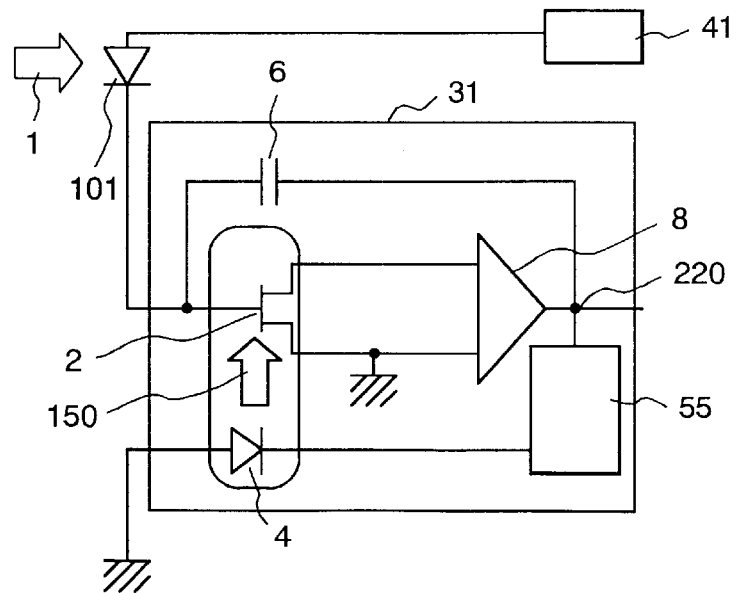
FIG. 5 is a circuit diagram of a preamplifier.
Figure 6:
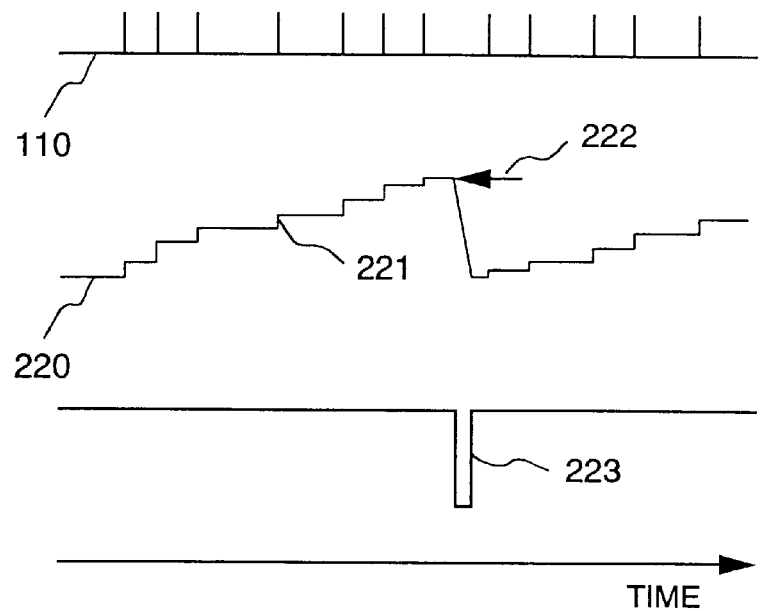
FIG. 6 is an illustration of waveforms for explaining the operation of the preamplifier of FIG.
Figure 7:
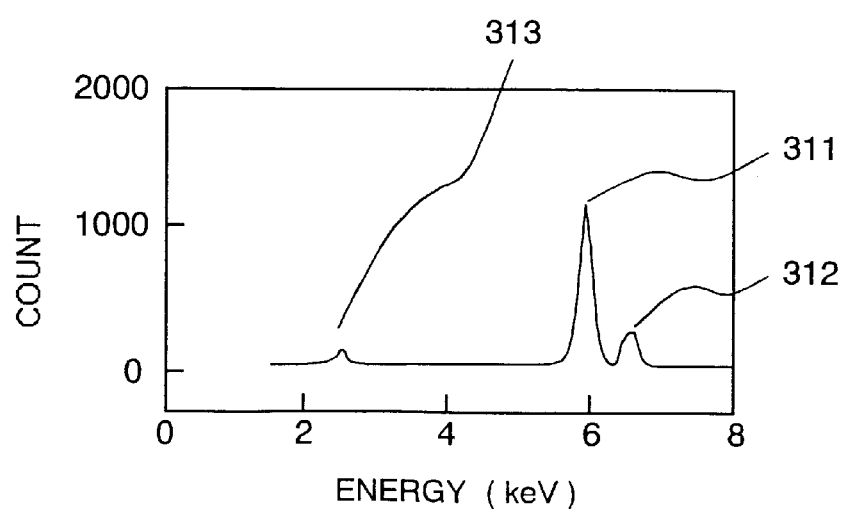
FIG. 7 is an illustration of a spectrum obtained by a parallel radiation detector.
Figure 8:
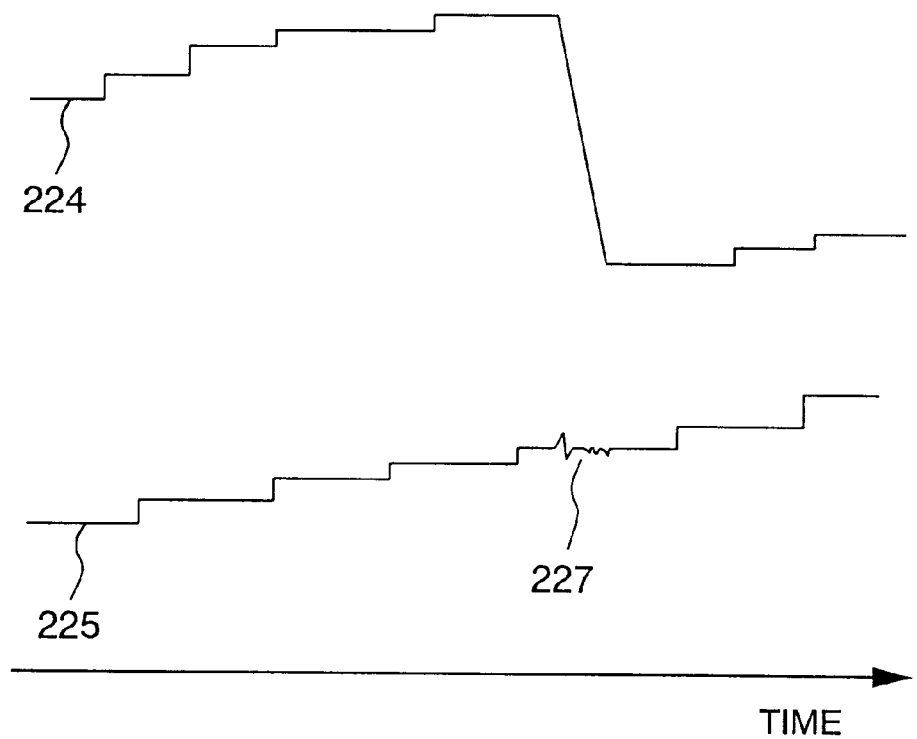
FIG. 8 is an illustration of output waveforms of the preamplifier in the parallel radiation detector.

A second embodiment of the present invention will be explained by reference to FIG. 3. This embodiment uses four high-purity silicon detectors 101–104 which are reverse-biased by a power supply 41. The charges produced by incident x-ray radiation 1 are converted into a staircase waveform x-ray signal voltage by preamplifiers 31–34. The comparator 55 inspects the output voltage level of the preamplifier 31 and the preamplifier 31 is configured so as to be returned to its initial state (reset) if the x-ray signal voltage exceeds 0 V. Concurrently with this, the comparator 55 sends the reset signal to a reset-signal control circuit 61 also. The x-ray signal voltage is subjected to a noise-reduction processing by a digital signal processing device 50. The signal from the digital signal processing device 50 is stored into a memory 301 in a main control device 300 via a selector 99. The computer 300 processes the data in the memory 301, and then displays them on a display device 302 or stores them in an external memory device 303 and outputs into a printing device 304.

The signal processing device 50 is comprised of analog-to-digital converters 71–74 for converting signals from the preamplifiers 31–34 into digital signals, temporary storage circuits 81–84 for storing the digital signals temporarily, digital signal processing parts 91–94 for performing arithmetic operations on the digital signals, and signal recognition circuits 201–204 for controlling the analog-to-digital converters 71–74 and the digital signal processing parts 91–94.

The signal recognition circuits 201–204 generates an inhibit signal to stop the analog-to-digital converters 71–74 by a signal from the reset-signal control circuit 61. The signal recognition circuits 201–204 also generates timing signals by detecting the time the output signals from the preamplifiers 31–34 change stepwise, that is, the time corresponding to incidence of x-rays.

When the digital signal processing parts 91–94 receives a given timing signal, they process the digital data which have been stored in the temporary storage circuits 81-84 since the time of two timing signals previous to the given timing signal. The signal processing is performed by summing weighted data in the region between one timing signal previous to and two timing signals previous to the given timing signal and those in the region between the given timing signal and one timing signal previous to it, and subtracting one from the other.

The weighting factors are arbitrarily selected by rewriting a program in the digital signal processing parts 91–94 via the main control device 300.

Insufficiency of capacitance in the temporary storage circuits 81–84 caused by insufficiency of incident x-ray radiation is prevented by a pseudo-timing pulse which is provided if a predetermined time elapses from a timing pulse. When an interval between two adjacent timing pulses which corresponds to an interval between two successive incidences of x-ray radiation is shorter than a processing time at the digital signal processing parts 91–94, an inhibit signal is generated to omit signal processing.

In this embodiment also, if the respective preamplifier 31–34 are reset, collection of all signals is inhibited, therefore the problem of the influence of extrinsic noise with the prior art detectors is eliminated, actual spectra can be obtained, and the energy resolution by using a plurality of detecting elements could be made equal to that by a single detecting element.

Further, the simultaneous usage of signals from four detecting elements increases the effective acceptance solid angle of the detector by a factor of about four, reduces the measuring time required for obtaining the analyzing sensitivity obtained by a single detecting element to one-fourth, and doubles the analyzing sensitivity in the equal measuring time, compared with the single detecting element.

In the embodiments 1 and 2, the high-purity silicon detecting elements are used, and it is obvious that other semiconductor materials such as lithium-diffused silicon crystals or high-purity germanium crystals can be also used for the radiation detecting elements in the present invention. In the above embodiments, two or four detecting elements are used, and the number of the detecting elements in the present invention are not limited to these numbers, in particular.

As described above, the present invention is configured such that, when a preamplifier for a given detection channel returns to an initial state, the remainder of channels stop collection of signals, and therefore the present invention prevents interference caused by noise and can provide the energy resolution equal to that obtained by a radiation detector employing a single detecting element.

The employment of plural detecting elements can increase the acceptance solid angle of the detection and the amount of x-ray radiation to be detected per unit time, and therefore can reduce the measuring time and increase the analyzing sensitivity.

Since the present invention has eliminated the need for very complicated schemes for prevention of interference by noise, it makes possible to house plural detecting elements in a single container, and facilitates the reduction of the size of the equipment and the manufacture of the equipment at low cost.

As described above, the present invention makes possible the manufacture of the radiation detector employing plural detecting elements and free from the deterioration of the energy resolution.

What is claimed is:

1. A parallel radiation detector comprising:
   a plurality of radiation detecting elements;
   a plurality of preamplifiers for converting signals from said plurality of radiation detecting elements into voltage signals;
   a signal processing device for processing said voltage signals from said plurality of preamplifiers;
   a main control device for controlling said signal processing device to analyze said voltage signals;
   a display device for displaying analyzed results from said signal processing device;
   a storage device for storing signals;
   a plurality of reset circuits corresponding to said plurality of preamplifiers, each of said reset circuits for generating a reset signal for returning the corresponding one of said plurality of preamplifiers to an initial state thereof when said voltage signal from the corresponding one of said plurality of preamplifiers reaches a predetermined voltage; and
   an inhibitor circuit for generating an inhibit signal for inhibiting said signal processing device from receiving and processing said voltage signals from said plurality of preamplifiers temporarily, based on said reset signal.

2. A parallel radiation detector according to claim 1, wherein said inhibit signal is related to a length of time of said reset signal.

3. A parallel radiation detector according to claim 2, wherein said inhibit signal is at least equal in length of time to the length of time of said reset signal.

4. A parallel radiation detector according to claim 2, wherein said inhibit signal is greater in length of time than the length of time of said reset signal.

5. A parallel radiation detector according to claim 1, wherein each of said plurality of preamplifiers is provided with a gain-control circuit independent of each other.

6. A parallel radiation detector according to claim 1, wherein said signal processing device includes a plurality of analog shaping amplifiers configured so as to be gain adjustable.

7. A parallel radiation detector according to claim 6, wherein said signal processing device is configured so as to adjust the gain of respective ones of said plurality of analog shaping amplifiers independently of one another.

8. A parallel radiation detector according to claim 1, wherein said signal processing device is provided with a plurality of analog-to-digital converters and a plurality of digital signal processing devices, converts said voltage signals from said plurality of preamplifiers into digital signals and calculates energy of incident x-ray radiation into said parallel radiation detector.

9. A parallel radiation detector according to claim 8, wherein said storage device is configured so as to store said digital signals from said plurality of digital signal processing devices in said storage device.

10. A parallel radiation detector according to claim 1, wherein a plurality of said parallel radiation detector are arranged to constitute a larger detection system.

11. A parallel radiation detector according to claim 1, wherein said parallel radiation detector is mounted in an electron microscope.

12. A parallel radiation detector according to claim 1, wherein said plurality of preamplifiers are mounted on a plurality of wiring boards smaller in number.

13. A parallel radiation detector according to claim 1, wherein said plurality of radiation detecting elements are semiconductor radiation detecting elements.

14. A parallel radiation detector comprising:
   detecting means for detecting incident radiation with a plurality of detecting elements and outputting a plurality of signals;
   a plurality of amplifying means for converting said plurality of signals into voltage signals;

signal processing means for processing said voltage signals;

control means for controlling said signal processing means to analyze said voltage signals;

display means for displaying analyzed results from said signal processing means;

storage means for storing signals;

a plurality of reset means corresponding to said plurality of amplifying means, each of said reset means for generating a reset signal for returning the corresponding one of said Plurality of amplifying means to an initial state thereof when said voltage signal from said corresponding one of said plurality of amplifying means reaches a predetermined voltage; and inhibit means for generating an inhibit signal for inhibiting said signal processing means from receiving and processing said voltage signals from said plurality of amplifying means temporarily, based on said reset signal.

15. A parallel radiation detector according to claim 14, wherein said plurality of detecting elements are semiconductor radiation detecting elements.

* * * * *